United States Patent
Wang et al.

(10) Patent No.: US 12,490,434 B2
(45) Date of Patent: Dec. 2, 2025

(54) MEMORY DEVICE

(71) Applicant: Yangtze Memory Technologies Co., Ltd., Wuhan (CN)

(72) Inventors: Qiguang Wang, Wuhan (CN); Jiefei Fu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 712 days.

(21) Appl. No.: 17/872,565

(22) Filed: Jul. 25, 2022

(65) Prior Publication Data

US 2022/0359568 A1 Nov. 10, 2022

Related U.S. Application Data

(60) Division of application No. 16/904,762, filed on Jun. 18, 2020, now Pat. No. 11,469,245, and a continuation of application No. PCT/CN2020/079441, filed on Mar. 16, 2020.

(51) Int. Cl.
*H10B 43/27* (2023.01)
*H10B 43/35* (2023.01)

(52) U.S. Cl.
CPC ............ *H10B 43/27* (2023.02); *H10B 43/35* (2023.02)

(58) Field of Classification Search
CPC ......... H10B 43/20; H10B 43/23; H10B 43/27
See application file for complete search history.

(56) References Cited

U.S. PATENT DOCUMENTS

| | | | |
|---|---|---|---|
| 9,437,604 B2 | 9/2016 | Lu et al. | |
| 2011/0147823 A1 | 6/2011 | Kuk et al. | |
| 2015/0123188 A1* | 5/2015 | Lu .......................... | H10D 62/83 |
| | | | 438/258 |
| 2017/0062468 A1 | 3/2017 | Son et al. | |
| 2017/0069647 A1 | 3/2017 | Ohashi et al. | |
| 2019/0139983 A1 | 5/2019 | Lee et al. | |
| 2019/0386108 A1 | 12/2019 | Nishikawa et al. | |

FOREIGN PATENT DOCUMENTS

| | | |
|---|---|---|
| CN | 104733469 A | 6/2015 |
| CN | 105390500 A | 3/2016 |
| CN | 105745749 A | 7/2016 |
| CN | 107482017 A | 12/2017 |
| CN | 108122924 A | 6/2018 |
| CN | 109768047 A | 5/2019 |
| CN | 109887922 A | 6/2019 |
| EP | 3316304 A2 | 5/2018 |

* cited by examiner

*Primary Examiner* — Christopher A Johnson
(74) *Attorney, Agent, or Firm* — Anova Law Group, PLLC

(57) ABSTRACT

A memory device includes a stacked structure. The stacked structure includes a plurality of interlayer dielectric layers and a gate structure between adjacent interlayer dielectric layers. A charge trapping layer and a blocking layer are between the adjacent interlayer dielectric layers. The blocking layer envelops the charge trapping layer and separates the charge trapping layer from the gate structure. A tunneling layer is disposed along a sidewall of the stacked structure and in contact with each of the gate structure and the charge trapping layer. A channel layer is disposed on a sidewall of the tunneling layer.

20 Claims, 10 Drawing Sheets

| | |
|---|---|
| Providing an initial semiconductor structure, including a base substrate; a stack structure, disposed on the base substrate and including alternately-arranged interlayer dielectric layers and first sacrificial layers; a channel trench formed through the stack structure and over the base substrate; and an epitaxial layer formed on the bottom of each channel trench and over the base substrate | S401 |
| Removing a portion of each first sacrificial layer close to the channel trench to form a trapping-layer trench recessed between adjacent interlayer dielectric layers | S402 |
| Forming a second sacrificial layer on the bottom and sidewalls of the trapping-layer trench and on the sidewalls of the plurality of dielectric layers exposed in the channel trench | S403 |
| Forming a charge trapping film to fill the trapping-layer trench | S404 |
| Removing the portion of each of the charge trapping film and the second sacrificial layer from the channel trench, the remaining portion of the charge trapping film forming a charge trapping layer | S405 |
| Forming a tunneling layer on the sidewalls of the charge trapping layer and the remaining second sacrificial layer along the channel trench, and forming a channel layer on the tunneling layer | S406 |
| Removing the plurality of first sacrificial layers | S407 |
| Removing the remaining second sacrificial layer to expose portions of the tunneling layer between the charge trapping layer and the adjacent interlayer dielectric layers | S408 |
| Forming a blocking layer on the exposed surface of the charge trapping layer | S409 |
| Forming a plurality of gate structures between adjacent interlayer dielectric layers, the plurality of gate structures in contact with the tunneling layer | S410 |

FIG. 3

MEMORY DEVICE

CROSS-REFERENCE TO RELATED APPLICATION

This application is a divisional of U.S. patent application Ser. No. 16/904,762, filed on Jun. 18, 2020, which is a continuation of International Application No. PCT/CN2020/079441, filed on Mar. 16, 2020, the entire content of all of which is incorporated herein by reference.

FIELD OF THE DISCLOSURE

The present disclosure generally relates to the field of semiconductor fabrication technology and, more particularly, relates to memory devices.

BACKGROUND

The production process of semiconductor electronic has made great progress with the development of the planar flash memory. However, in recent years, the continuous development of the planar flash memory encountered a number of challenges, such as physical limits, existing lithography limits, storage electron density limits, etc. In this context, in order to solve the difficulties encountered by the planar flash memory and pursue lower production cost per storage unit, various three-dimensional (3D) flash memory structures, including 3D not-or (NOR) and 3D not-and (NAND), have emerged.

In the 3D flash memory of the NOR type structure, the storage units are arranged in parallel between the bit line and the ground line, while in the 3D flash memory of the NAND type structure, the storage units are arranged in series between the bit line and the ground line. An NAND flash memory with a tandem structure has a lower read speed, but has a higher write speed and erase speed. Therefore, the NAND flash memory is suitable for storing data. In addition, the NAND flash memory also demonstrates many advantages, such as small unit size and large storage capacity, for data storage.

A charge trapping 3D memory is a basic device that allows for three-dimensional integration. A key structure in a charge trapping 3D memory device is a gate stack, and the gate stack usually has a multi-layer structure which includes a channel layer, a tunneling layer, a charge trapping layer, and a barrier layer. The film layers of the gate stack are sequentially disposed on the sidewall surface of the channel. The gate stack is used to control the charge storage function of the memory device, and the channel layer of the gate stack provides a path for charge carriers. Therefore, the resistance of the channel layer plays an important role in the reliability and low-temperature characteristics of the memory device.

As the demand on high storage density increases, the number of stack layers in a 3D memory device may also increase, and the channel length may be extended. When the channel length increases, the overall resistance of the channel also increases, and thus the conduction performance of the channel may be degraded and the low-temperature mobility of the carriers may be reduced. As such, the low-temperature programming performance and the trans-temperature performance may not be desired. Moreover, because the overall impedance of the channel is high, when performing program/read operations at an array level, the programming background noise may be enhanced, which may further cause the distribution of the threshold voltage to be widened at the array level, and the device reliable window to be reduced.

Currently, the method to improve the conduction performance of a long channel is to adjust the thickness of the channel layer and also increase the crystallinity and the grain size of the channel layer. Adjusting the thickness of the channel layer and improving the crystallinity and the grain size may be able to further increase the conduction current of the channel and reduce the trapping effect at grain boundaries or at the layer interfaces, and thus the conduction performance of the channel may be improved. However, as the number of the stack layers increases, more stringent requirements on the fabrication process may be imposed in order to further improve the quality of channel.

The disclosed memory device and fabrication method thereof are directed to solve one or more problems set forth above and other problems in the art.

BRIEF SUMMARY OF THE DISCLOSURE

One aspect of the present disclosure provides a memory device. The memory device includes a stacked structure. The stacked structure includes a plurality of interlayer dielectric layers and a gate structure between adjacent interlayer dielectric layers. A charge trapping layer and a blocking layer are between the adjacent interlayer dielectric layers. The blocking layer envelops the charge trapping layer and separates the charge trapping layer from the gate structure. A tunneling layer is disposed along a sidewall of the stacked structure and in contact with each of the plurality of interlayer dielectric layers, the gate structure, the charge trapping layer, and the blocking layer. A channel layer is disposed on a sidewall of the tunneling layer.

Another aspect of the present disclosure provides a memory device. The memory device includes a stacked structure. The stacked structure includes a plurality of interlayer dielectric layers and a gate structure between adjacent interlayer dielectric layers. A tunneling layer is disposed on and extending along a sidewall of the stacked structure. A charge trapping layer and a blocking layer are between adjacent interlayer dielectric layers. Each of the gate structure, the charge trapping layer, and the blocking layer is in contact with the tunneling layer.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

FIG. 3 illustrates a flowchart of an exemplary fabrication method according to various embodiments of the present disclosure;

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
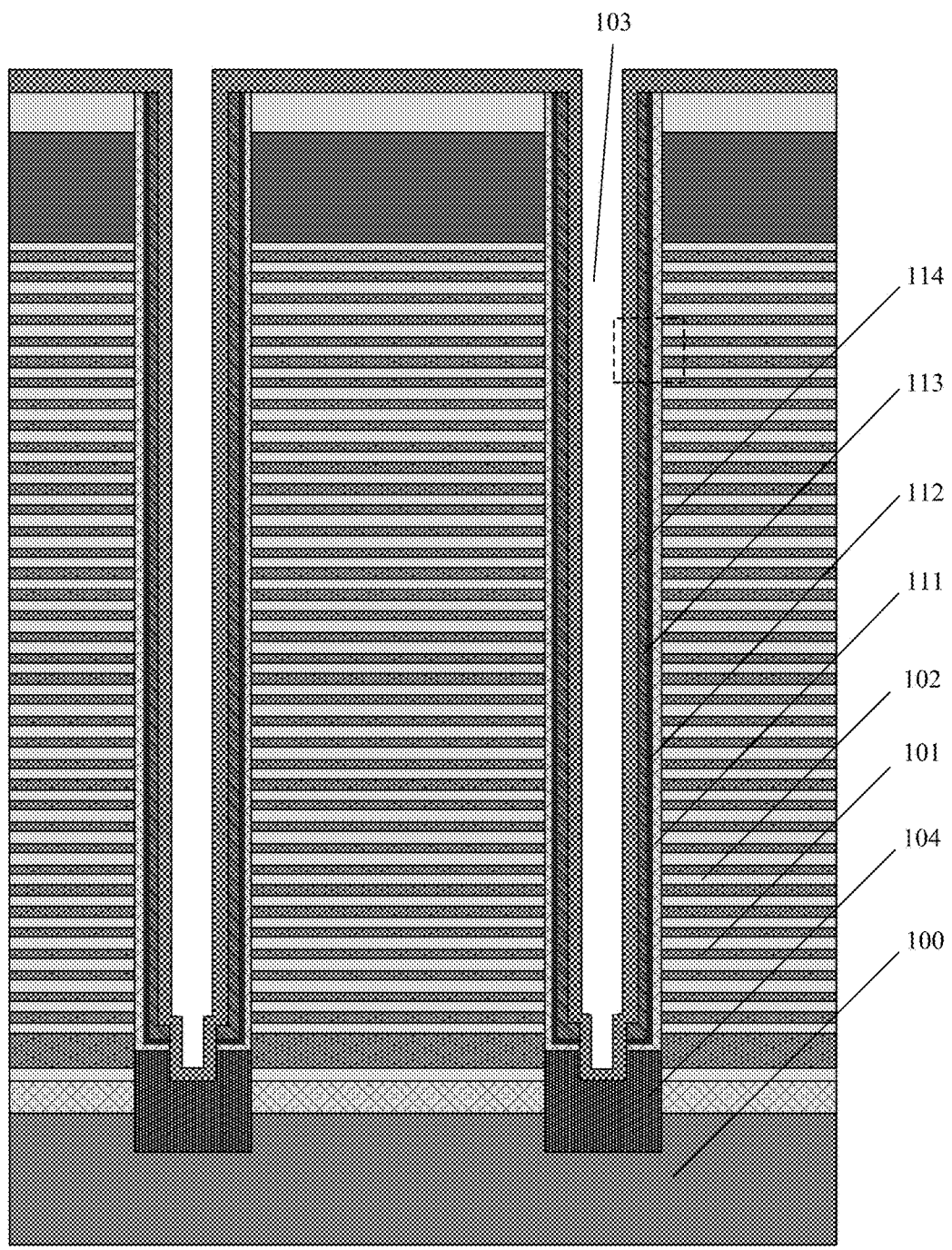
FIG. 1 illustrates a schematic cross-sectional view of a 3D NAND memory device.
Figure 2:
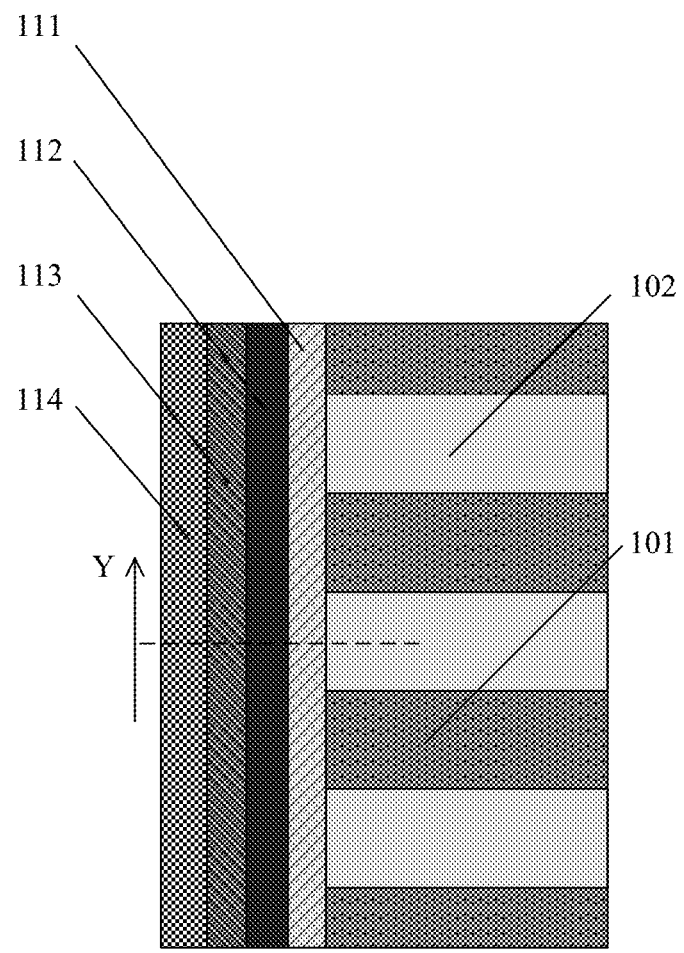
FIG. 2 illustrates an enlarged schematic view of the structure shown in a dashed-line frame in FIG. 1.

FIG. 1 illustrates a schematic cross-sectional view of a 3D NAND memory device, and FIG. 2 illustrates an enlarged schematic view of the structure shown in a dashed-line frame in FIG. 1. Referring to FIGS. 1-2, a 3D NAND memory device includes a base substrate 100, and a stack structure including a plurality of interlayer dielectric layers 101 and a plurality of gate layers 102. The plurality of interlayer dielectric layers 101 and the plurality of gate layers 102 are alternately disposed to form the stack structure. The 3D memory device also includes a plurality of channel trenches 103 formed through the stack structure and over the base substrate 100, and an epitaxial layer 104 formed on the bottom of each channel trench 103 and over the base substrate 100.

The 3D NAND memory device further includes a blocking layer 111, a charge trapping layer 112, a tunneling layer 113, and a channel layer 114 sequentially formed on the sidewall surface of the channel trench 103. As such, the blocking layer 111, the charge trapping layer 112, the tunneling layer 113, and the channel layer 114 together form a gate stack on the sidewall surface of the channel trench 103.

It should be noted that FIGS. 1-2 only illustrate the structures that are relevant to the present disclosure, the 3D NAND memory device may further include other components and/or structures for achieving complete functions of the device.

In the 3D NAND memory device, the gate stack formed by the blocking layer 111, the charge trapping layer 112, the tunneling layer 113, and the channel layer 114 serves as a key structure of the charge trapping 3D memory. In the multi-layer gate stack, the tunneling layer 113 is made of silicon oxide, the charge trapping layer 112 is made of silicon nitride, and the barrier layer 111 is made of silicon oxide. The gate stack is used to control the charge storage function of the memory, and the channel layer 114 of the gate stack provides a path for charge carriers. Therefore, the resistance of the channel layer plays an important role in the reliability and low-temperature characteristics of the memory device.

To improve the storage density, in the 3D NAND memory device, the number of the stack layers is large and the channel length is long. Therefore, the overall resistance of the channel increases, causing the conduction performance of the channel to be degraded and the mobility of the carriers to be reduced at low temperatures. As such, the low-temperature programming performance and the trans-temperature performance may not be desired. Moreover, because the overall impedance of the channel is high, when performing program/read operations at an array level, the programming background noise may be enhanced, which may further cause the distribution of the threshold voltage to be widened at the array level, and the device reliable window to be reduced.

According to existing technology, in order to improve the conduction performance of a long channel, the thickness of the channel layer may be adjusted, and the crystallinity and the grain size of the channel layer may be increased. However, as the number of the stack layers increases, more stringent requirements on the fabrication process may be imposed in order to further improve the quality of channel.

The present disclosure provides a method for fabricating a 3D NAND memory device. FIG. 3 illustrates a flowchart of an exemplary fabrication method according to various embodiments of the present disclosure, and FIGS. 4-16 illustrate schematic views of semiconductor structures at certain stages of an exemplary method according to various embodiments of the present disclosure.

Figure 4:
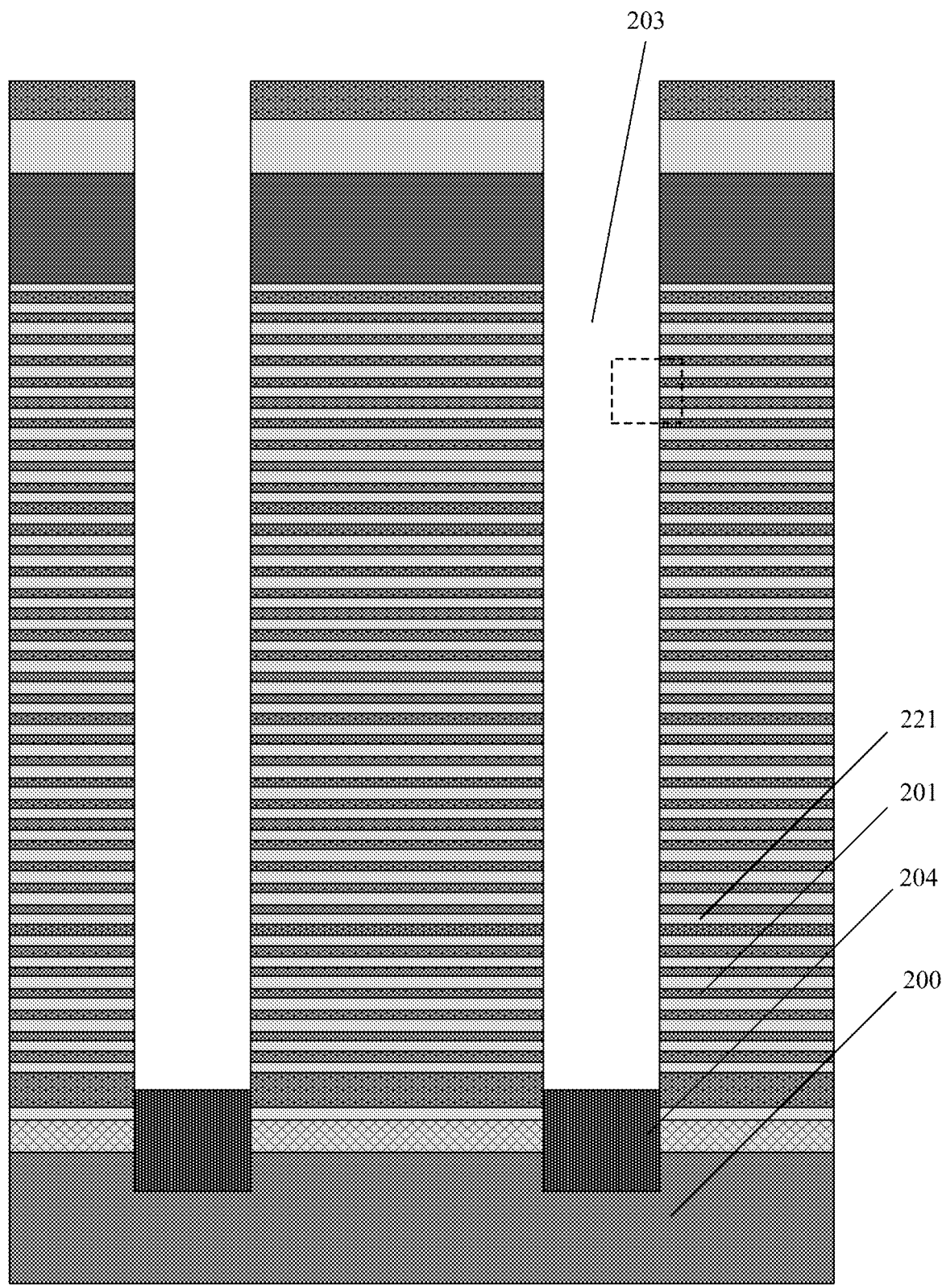
FIGS. 4-15 illustrate schematic views of semiconductor structures at certain stages of an exemplary method according to various embodiments of the present disclosure.

Referring to FIG. 3, an initial semiconductor structure may be provided, and the initial semiconductor structure may include a base substrate; a stack structure including a plurality of interlayer dielectric layers and a plurality of first sacrificial layers that are alternately disposed on the base substrate; a channel trench formed through the stack structure and over the base substrate; and an epitaxial layer formed on the bottom of the channel trench and over the base substrate (S401). FIG. 4 illustrates a schematic cross-sectional view of a semiconductor structure consistent with various embodiments of the present disclosure, and FIG. 5 illustrates an enlarged schematic view of the structure shown in a dashed-line frame in FIG. 4.

Figure 5:
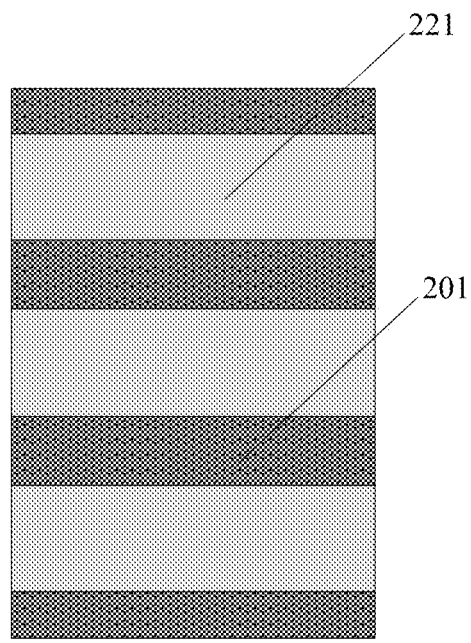

Referring to FIGS. 4-5, an initial semiconductor structure may be provided. The initial semiconductor structure may include a base substrate 200, a stack structure including a plurality of interlayer dielectric layers 201 and a plurality of first sacrificial layers 221 that are alternately disposed on the base substrate 200; a channel trench 203 formed through the stack structure and over the base substrate 200; and an epitaxial layer 204 formed on the bottom of the channel trench 203 and over the base substrate 200.

In one embodiment, the base substrate 200 may be made of silicon, germanium, silicon germanium, or any appropriate semiconductor material, the plurality of interlayer dielectric layers 201 may be made of an oxide, e.g., silicon oxide, and the plurality of first sacrificial layers 221 may be made of a nitride, e.g., silicon nitride. In one embodiment, the thickness of each first sacrificial layer 221 may be in a range of approximately 20 nm to 40 nm.

Figure 6:
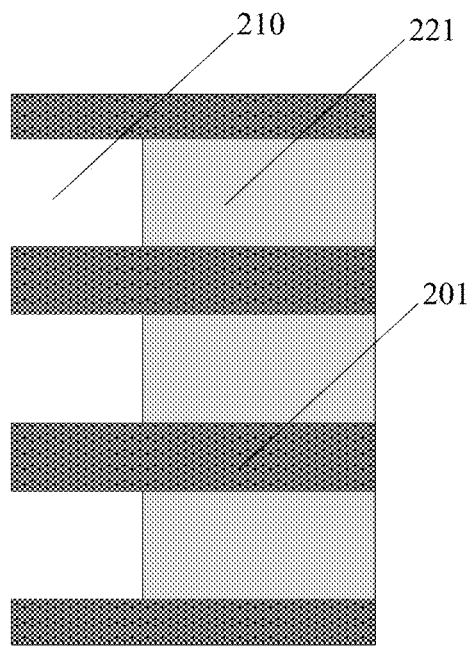

Further, returning to FIG. 3, a portion of each first sacrificial layer close to the channel trench may be removed to form a trapping-layer trench recessed between adjacent interlayer dielectric layers (S402). FIG. 6 illustrates a schematic cross-sectional view of a semiconductor structure consistent with various embodiments of the present disclosure.

Referring to FIG. 6, a portion of each first sacrificial layer 221 that is close to the channel trench 203 (referring to FIG. 4) may be removed to form a trapping-layer trench 210 recessed between adjacent interlayer dielectric layers 201. In one embodiment, the portion of the first sacrificial layer 221 may be removed through a wet etching process. After removing the portion of the first sacrificial layer 221, the depth of the trapping-layer trench 210 in a direction perpendicular to the sidewall surface of the channel trench 203 may be in a range of approximately 20 nm to 50 nm. It should be noted that during the etching process, the etching rate of the material used for forming the first sacrificial layer 221 may be substantially larger than the etching rate of the material used for forming the interlayer dielectric layer 201, and thus the plurality of interlayer dielectric layers 201 may be slightly removed or may even remain unchanged after the etching process.

Figure 7:
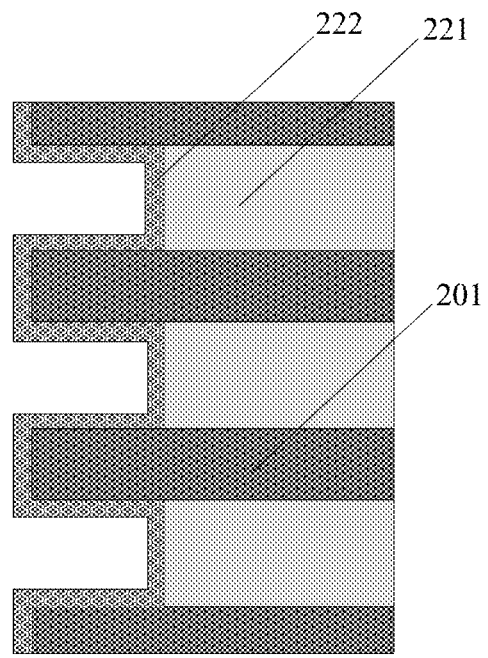

Further, returning to FIG. 3, a second sacrificial layer may be formed on the bottom and sidewalls of the trapping-layer trench and the sidewalls of the plurality of interlayer dielectric layers exposed in the channel trench (S403). FIG. 7 illustrates a schematic cross-sectional view of a semiconductor structure consistent with various embodiments of the present disclosure.

Referring to FIG. 7, a second sacrificial layer 222 may be formed on the bottom and sidewalls of the trapping-layer trench 210 and on the sidewalls of the plurality of interlayer dielectric layers 201 exposed in the channel trench 203 (referring to FIG. 4). The second sacrificial layer 222 may also cover the sidewall surface of the channel trench 203 (referring to FIG. 4). Because the depth direction of the trapping-layer trench 210 is perpendicular to the sidewall surface of the channel trench 203, the sidewall surface of the trapping-layer trench 210 may expose adjacent interlayer dielectric layers 201, and the bottom surface of the trapping-layer trench 210 may expose the corresponding first sacrificial layer 221.

In one embodiment, the second sacrificial layer 222 may be made of $GeO_2$, polycrystalline silicon, a high-k dielectric material (e.g., a material with a relative dielectric constant larger than 3.9), etc. The second sacrificial layer 222 may be formed through a chemical vapor deposition (CVD) process, an atomic layer deposition (ALD) process, or any other appropriate deposition process. The thickness of the second sacrificial layer may be in a range of approximately 3 nm to 5 nm.

Figure 8:
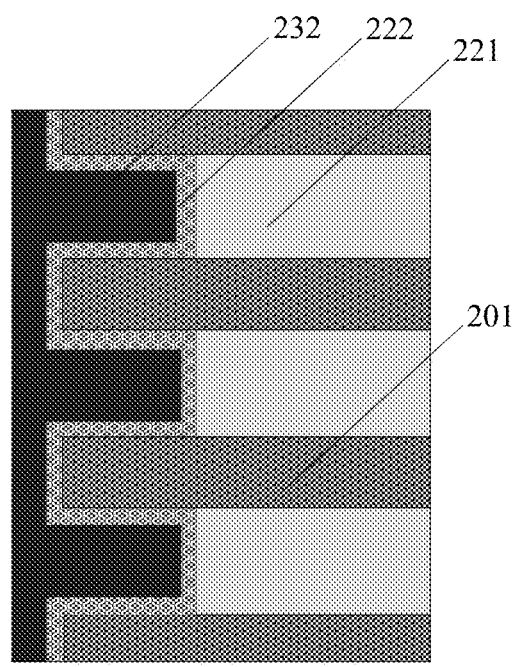

Further, returning to FIG. 3, a charge trapping film may be formed to fill the trapping-layer trench and also cover the sidewall surface of the channel trench (S404). FIG. 8 illustrates a schematic cross-sectional view of a semiconductor structure consistent with various embodiments of the present disclosure.

Referring to FIG. 8, a charge trapping film 232 may be formed to fill the trapping-layer trench 210 (referring to FIG. 6). The charge trapping film 232 may also cover the sidewall surface of the channel trench 203 (referring to FIG. 4). In one embodiment, the charge trapping film 232 may be made of silicon nitride, silicon oxynitride, or any other appropriate material. Alternatively, in other embodiments, the charge trapping film may have a composite structure formed by silicon nitride and silicon oxynitride. In one embodiment, the charge trapping film 232 may be formed through a CVD process, an ALD process, or any other appropriate deposition process.

In one embodiment, during a subsequently performed acid etching process, the etch rate of the material used for forming the second sacrificial layer 222 may be substantially larger than the etch rate of the material used for forming the charge trapping film 232.

Figure 9:
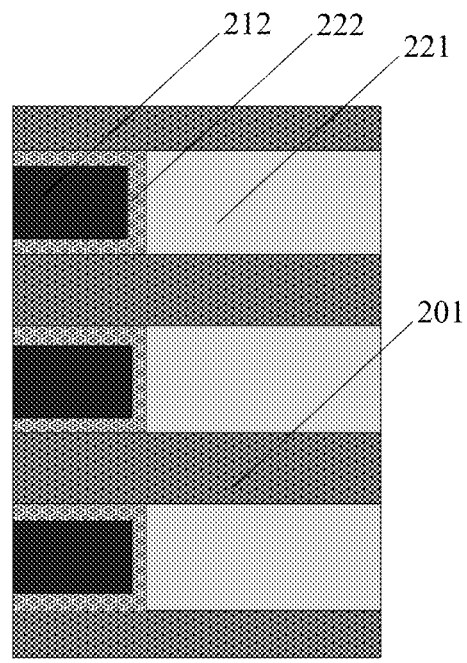

Further, returning to FIG. 3, a portion of each of the charge trapping film and the second sacrificial layer may be removed from the channel trench, such that the remaining portion of the charge trapping film may form a charge trapping layer (S405). FIG. 9 illustrates a schematic cross-sectional view of a semiconductor structure consistent with various embodiments of the present disclosure.

Referring to FIG. 9, a portion of the charge trapping film 232 (referring to FIG. 8) and a portion of the second sacrificial layer 222 may be removed from the channel trench 203 (referring to FIG. 4) until the sidewall surfaces of the plurality of interlayer dielectric layers 201 are exposed in the channel trench 203. The remaining portion of the charge trapping layer 232 may form a charge trapping layer 212. As such, in a direction perpendicular to the sidewall surface of the channel trench 203, the sidewall surfaces of the charge trapping layer 212 and the second sacrificial layer 222 may be leveled with the sidewall surfaces of the plurality of interlayer dielectric layers 201. In addition, the charge trapping layer 212 may include a plurality of discrete portions with each portion located between two adjacent interlayer dielectric layers 201 and separated from the interlayer dielectric layers 201 by the second sacrificial layer 222. In one embodiment, the process of removing the portion of the charge trapping film 232 and the second sacrificial layer 222 formed on the sidewall surface of the channel trench 203 may be a dry etching process or a wet etching process.

Figure 10:
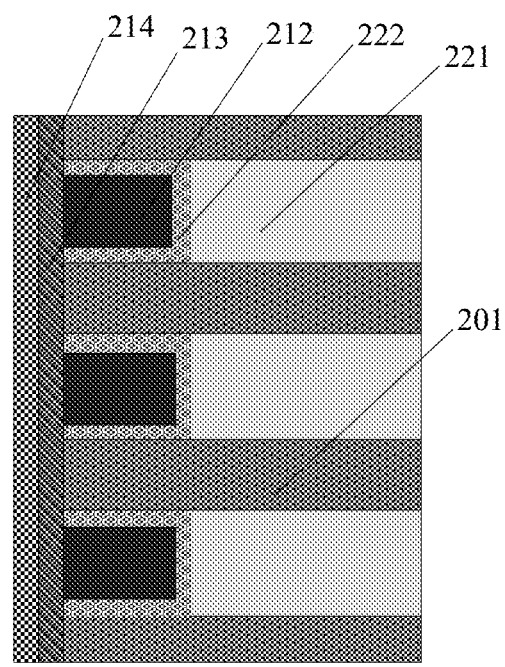

Further, returning to FIG. 3, a tunneling layer may be formed on the sidewalls of the charge trapping layer and the remaining second sacrificial layer along the channel trench and a channel layer may be formed on the tunneling layer (S406). FIG. 10 illustrates a schematic cross-sectional view of a semiconductor structure consistent with various embodiments of the present disclosure.

Referring to FIG. 10, a tunneling layer 213 may be formed on the sidewalls of the charge trapping layer 212 and the remaining second sacrificial layer 222 along the channel trench 203 (referring to FIG. 4). Moreover, a channel layer 214 may be formed on the tunneling layer 213. In one embodiment, the tunneling layer 213 may be made of silicon oxide, silicon oxynitride, or a high-k dielectric material. In other embodiments, the tunneling layer 213 may have a composite structure formed by silicon oxide, silicon oxynitride, and high-k dielectric materials. In one embodiment, the tunneling layer 213 may be formed through a CVD process, an ALD process, or any other appropriate deposition process. In one embodiment, the thickness of the tunneling layer 213 may be in a range of approximately 1 nm to 10 nm.

In one embodiment, the channel layer 214 may be made of amorphous silicon, polycrystalline silicon, or any other appropriate material, and the channel layer 214 may be connected to the epitaxial layer 204 formed at the bottom of the channel trench 203 (referring to FIG. 4). In one embodiment, the channel layer 214 may be formed through a CVD process, an ALD process, or any other appropriate deposition process.

Figure 11:
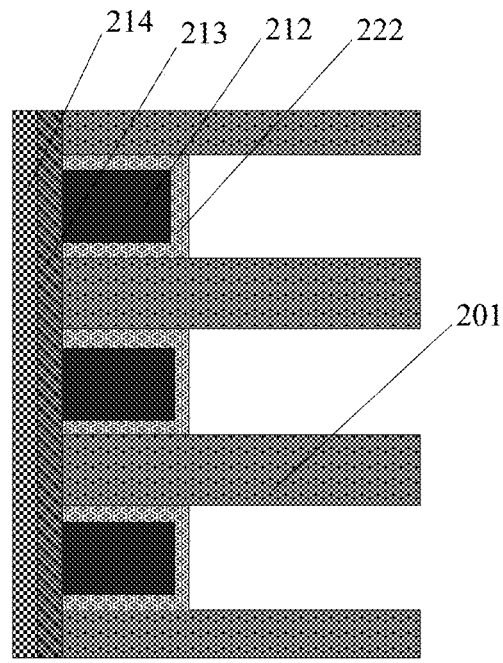

Further, returning to FIG. 3, the plurality of first sacrificial layers may be removed (S407). FIG. 11 illustrates a schematic cross-sectional view of a semiconductor structure consistent with various embodiments of the present disclosure.

Referring to FIG. 11, the plurality of first sacrificial layers 221 (referring to FIG. 10) may be removed. The plurality of first sacrificial layers 221 may be removed through an acid etching process. In one embodiment, prior to removing the plurality of first sacrificial layers 221, a plurality of common-source trenches (not shown) may be formed in the stack structure. In one embodiment, a channel trench process, may be completed before forming the plurality of common-source trenches. For example, a contact plug for the channel layer may be formed in the channel trench. The plurality of common-source trenches may be formed in the stack structure through an etching process. Further, by performing an acid etching process through the plurality of common-source trenches, the plurality of first sacrificial layers in the stack structure may be removed.

Figure 12:
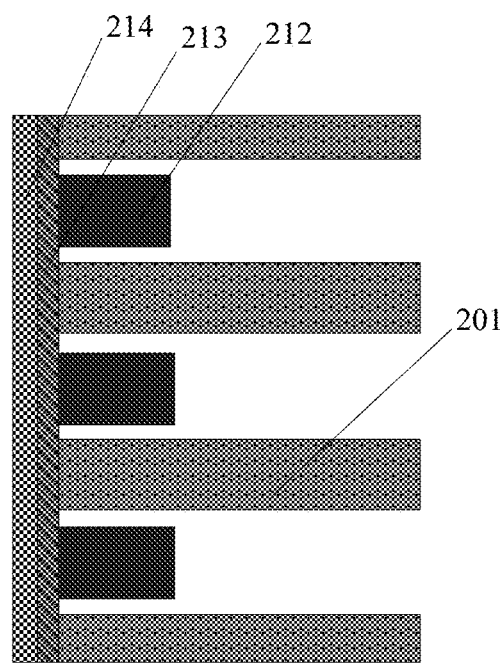

Returning to FIG. 3, the remaining second sacrificial layer may be removed to expose portions of the tunneling layer between the charge trapping layer and the adjacent interlayer dielectric layers (S408). FIG. 12 illustrates a schematic cross-sectional view of a semiconductor structure consistent with various embodiments of the present disclosure.

Referring to FIG. 12, the remaining second sacrificial layer 222 (referring to FIG. 11) may be further removed, such that portions of the tunneling layer 213 may be exposed between the charge trapping layer 212 and the adjacent interlayer dielectric layers 201. In one embodiment, after removing the plurality of first sacrificial layers 221 (referring to FIG. 10), the etching process may further remove the second sacrificial layer 222.

In one embodiment, the second sacrificial layer 222 may be completely removed. In other embodiment, the second sacrificial layer 222 may be substantially removed, and only a small portion of the second sacrificial layer 222 may remain at a position close to the tunneling layer 213.

Figure 13:
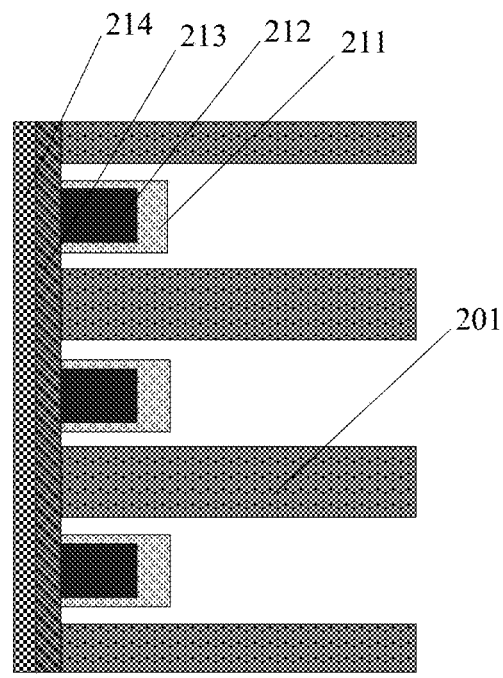

Further, returning to FIG. 3, a blocking layer may be formed on the exposed surface of the charge trapping layer (S409). FIG. 13 illustrates a schematic cross-sectional view of a semiconductor structure consistent with various embodiments of the present disclosure.

Referring to FIG. 13, a blocking layer 211 may be formed on the exposed surface of the charge trapping layer 212. In one embodiment, the blocking layer 211 may be made of silicon oxide, and the thickness of the blocking layer 211 may be in a range of approximately 2 nm to 10 nm. The blocking layer 211 may be formed through a thermal oxidization process or an in-situ steam generation (ISSG) process, and thus the blocking layer 211 may be a dense film layer made of silicon oxide. In one embodiment, after forming the blocking layer 211 on the exposed surface of the charge trapping layer 212, the blocking layer 211 may be spaced from each adjacent interlayer dielectric layer 201 by a gap with a size in a range of approximately 3 nm to 5 nm in a direction parallel to the sidewall surface of the channel trench.

Figure 14:
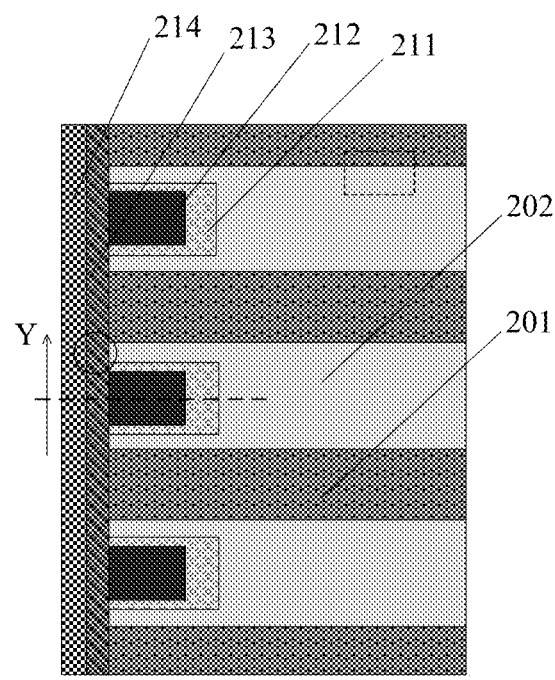
Figure 15:
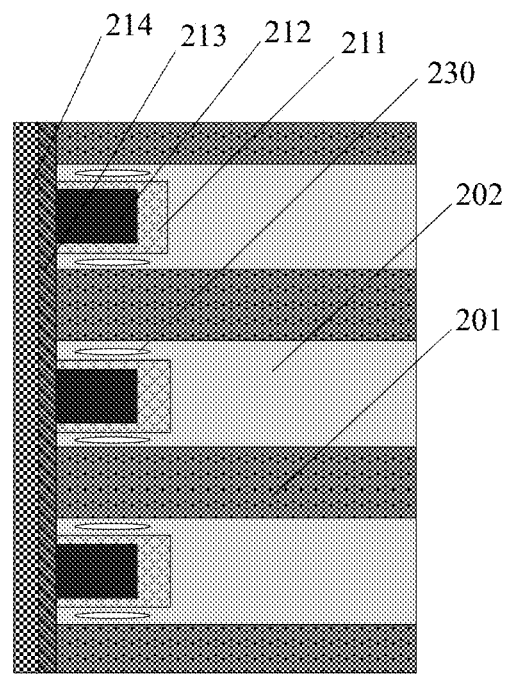
Figure 16:
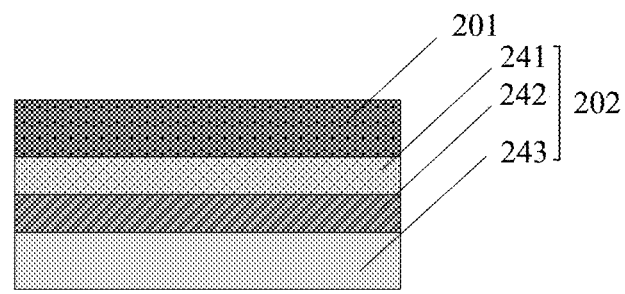
FIG. 16 illustrates an enlarged schematic view of the structure shown in a dashed-line frame in FIG. 14.

Further, returning to FIG. 3, a plurality of gate structures may be formed to fill the empty space between adjacent interlayer dielectric layers (S410). FIG. 14 illustrates a schematic cross-sectional view of a semiconductor structure consistent with various embodiments of the present disclosure, and FIG. 15 illustrates a schematic cross-sectional view of another semiconductor structure consistent with various embodiments of the present disclosure. FIG. 16 illustrates an enlarged schematic view of the structure shown in a dashed-line frame in FIG. 14.

Referring to FIGS. 14-15, a plurality of gate structures 202 may be formed to fill the empty space between adjacent interlayer dielectric layers 201. Referring to FIG. 16, in one embodiment, each gate structure 202 may be a metal gate structure, including a high-k dielectric layer 241, a work function layer 242, and a metal-gate layer 243 sequentially formed in the empty space between the corresponding interlayer dielectric layers 201. For example, the high-k dielectric layer 241 may be formed on the exposed surfaces of the plurality of interlayer dielectric layers 201, the tunneling layer 213, and the blocking layer 211. The work function layer 142 may then be formed on the exposed surface of the high-k dielectric layer 241 between adjacent interlayer dielectric layers 201. Further, the metal-gate layer 243 may be formed on the interlayer dielectric layers 201.

In one embodiment, referring to FIG. 14, the space between the blocking layer 211 and the plurality of interlayer dielectric layers 201 may be fully filled by the plurality of gate structures 202. In other embodiments, referring to FIG. 15, when forming the gate structure 202, the metal-gate layer 243 (referring to FIG. 16) may not be completely filled into the space between the blocking layer 211 and the plurality of interlayer dielectric layers 201, leaving a plurality of voids 230 between the blocking layer 211 and the plurality of interlayer dielectric layers 201.

Referring to FIG. 14, as indicated by a circle, the gate structure 202 may be directly in contact with the tunneling layer 213 at positions close to each corner formed by the tunneling layer 213 and the plurality of interlayer dielectric layers 201. Therefore, along a Y direction, e.g., the direction parallel to the sidewall surface of the channel trench 203 (referring to FIG. 4), the distance between the channel layer 214 and the gate structure 202 may vary, and at the positions where the gate structure 202 is directly in contact with the tunneling layer 213, the distance between the channel layer 214 and the gate structure 202 may be the shortest. Correspondingly, when performing program/read operations, the resistance of the channel at these positions may be low. As such, the overall resistance of the channel may be reduced, the conduction current through the channel layer 214 may be effectively increased, and thus the response speed to program/read operations may be improved. Moreover, as the overall resistance of the channel decreases, the programming background noise also decreases, and thus the array-level widening effect of the distribution of the threshold voltage may be suppressed.

According to the disclosed method for fabricating a 3D NAND memory device, a portion of the gate structure is directly in contact with the tunneling layer. Therefore, at the positions where the gate structure is directly in contact with the tunneling layer, the distance from the gate to the channel is reduced, and correspondingly, when performing program/read operations, the resistance of the channel at these positions may be low. As such, the overall resistance of the channel may be reduced, the conduction current through the channel may be effectively increased, and thus the response speed to program/read operations may be improved. In addition, the disclosed method also improves the channel conduction performance at low temperatures, thereby improving the low-temperature programming performance and the trans-temperature performance. Moreover, as the overall resistance of the channel decreases, the programming background noise also decreases, and thus the array-level widening effect of the distribution of the threshold voltage may be suppressed.

The present disclosure also provides a memory device. FIG. 14 illustrates a schematic cross-sectional view of an exemplary memory device consistent with various embodiments of the present disclosure. FIG. 16 illustrates an enlarged schematic view of the structure shown in a dashed-line frame in FIG. 14.

Referring to FIG. 14, the memory device may include a base substrate (not shown), and a plurality of interlayer dielectric layers 201 and a plurality of gate structures 202 that are alternately stacked over the base substrate to form a stack structure. In one embodiment, the distance between adjacent interlayer dielectric layers 201 may be in a range of approximately 20 nm to 40 nm.

The memory device may include a tunneling layer 213 formed along the sidewall of the stacked structure. The memory device may further include a channel layer 214 formed on the tunneling layer 213 opposite to the plurality of interlayer dielectric layers 201 and the plurality of gate structures 202. The tunneling layer 213 may separate the channel layer 214 from the plurality of interlayer dielectric layers 201 and the plurality of gate structures 202.

In one embodiment, the tunneling layer 213 may be made of silicon oxide, silicon oxynitride, or a high-k dielectric material. In other embodiments, the tunneling layer 213 may have a composite structure formed by silicon oxide, silicon oxynitride, and high-k dielectric materials. In one embodiment, the thickness of the tunneling layer 213 may be in a range of approximately 1 nm to 10 nm. In one embodiment, the channel layer 214 may be made of amorphous silicon, polycrystalline silicon, or any other appropriate material.

The memory device may also include a charge trapping layer 212 formed between the tunneling layer 213 and the plurality of gate structures 202 in the direction perpendicular to the tunneling layer 213, and between adjacent interlayer dielectric layers 201. A side surface of the charge trapping layer 212 may be directly in contact with the tunneling layer 213, and a portion of each gate structure of the plurality of gate structures 202 directly in contact with the tunneling layer 213 may separate the charge trapping layer 212 from the plurality of interlayer dielectric layers 201. In one embodiment, the dimension of the charge trapping layer 212 in the direction perpendicular to the tunneling layer 213 may be in a range of approximately 18 nm to 40 nm.

The memory device may further include a blocking layer 211 formed on the charge trapping layer 212. The blocking layer 211 may separate the charge trapping layer 212 from the gate structure 202. Therefore, the blocking layer 211 and a portion of each gate structure 202 may be directly in contact with the tunneling layer 213 and thus separate the charge trapping layer 212 from the plurality of interlayer dielectric layers 201. In one embodiment, the thickness of the blocking layer 211 may be in a range of approximately 2 nm to 10 nm. In one embodiment, in a direction perpendicular to the plurality of interlayer dielectric layers 201, the thickness of the portion of the gate structure 202 that separates the blocking layer 211 from an adjacent interlayer dielectric layer 201 may be in a range of approximately 3 nm to 5 nm.

In one embodiment, referring to FIG. 14, the space between the blocking layer 211 and the plurality of interlayer dielectric layers 201 may be fully filled by the plurality of gate structures 202. In other embodiments, referring to FIG. 15, the space between the blocking layer 211 and the plurality of interlayer dielectric layers 201 may not be fully filled by the plurality of gate structures 202.

In one embodiment, referring to FIG. 16, each gate structure 202 may include a high-k dielectric layer 241 formed on the interlayer dielectric layer 201. The high-k dielectric layer 241 may also be formed on the tunneling layer 213 and the blocking layer 211. The gate structure 202 may also include a work function layer 242 formed on the high-k dielectric layer 241, and a metal-gate layer 243 formed on the work function layer 242.

According to the disclosed memory device, a portion of the gate structure is directly in contact with the tunneling layer. Therefore, at the positions where the gate structure is directly in contact with the tunneling layer, the distance from the gate to the channel is reduced, and correspondingly, when performing program/read operations, the resistance of the channel at these positions may be low. As such, the overall resistance of the channel may be reduced, the conduction current through the channel may be effectively increased, and thus the response speed to program/read operations may be improved. In addition, the disclosed memory device also improves the channel conduction performance at low temperatures, thereby improving the low-temperature programming performance and the trans-temperature performance. Moreover, as the overall resistance of the channel decreases, the programming background noise also decreases, and thus the array-level widening effect of the distribution of the threshold voltage may be suppressed.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A memory device, comprising:
a stacked structure comprising a plurality of interlayer dielectric layers and a gate structure between adjacent interlayer dielectric layers;
a charge trapping layer and a blocking layer, between the adjacent interlayer dielectric layers, wherein the blocking layer envelops the charge trapping layer and separates the charge trapping layer from the gate structure;
a tunneling layer along a sidewall of the stacked structure and in contact with each of the gate structure and the charge trapping layer; and
a channel layer on a sidewall of the tunneling layer.

2. The device according to claim 1, wherein:
the tunneling layer is further in contact with each of the blocking layer and the plurality of interlayer dielectric layers.

3. The device according to claim 1, wherein:
the charge trapping layer and the blocking layer are sandwiched between a first portion and a second portion of the gate structure in a direction along the sidewall of the stacked structure.

4. The device according to claim 3, wherein:
each of the first and second portions of the gate structure is in contact with the tunneling layer and separates the blocking layer from a corresponding interlayer dielectric layer; and/or
each of the first and second portions of the gate structure has a thickness in a range of approximately 3 nm to 5 nm in the direction along the sidewall of the stacked structure.

5. The device according to claim 3, wherein:
the charge trapping layer and the blocking layer are between the tunneling layer and the gate structure in a direction perpendicular to the sidewall of the stacked structure.

6. The device according to claim 1, wherein:
the gate structure comprises a high-k dielectric layer, a work function layer, and a metal-gate layer, sequentially disposed between the adjacent interlayer dielectric layers.

7. The device according to claim 1, wherein:
a distance between the adjacent interlayer dielectric layers in a direction along the sidewall of the stacked structure is in a range of approximately 20 nm to 40 nm; and/or
a thickness of the blocking layer is in a range of approximately 2 nm to 10 nm.

8. The device according to claim 1, wherein:
the plurality of interlayer dielectric layers is made of a material comprising silicon oxide.

9. The device according to claim 1, wherein:
the charge trapping layer is made of a material comprising at least one of silicon nitride, silicon oxynitride, or a high-k dielectric material; and
a dimension of the charge trapping layer in the direction perpendicular to the sidewall of the stacked structure is in a range of approximately 18 nm to 40 nm.

10. The device according to claim 1, wherein:
the tunneling layer is made of a material comprising at least one of silicon oxide, silicon oxynitride, or a high-k dielectric material; and
a thickness of the tunneling layer in the direction perpendicular to the sidewall of the stacked structure is in a range of approximately 1 nm to 10 nm.

11. The device according to claim 10, wherein:
each of the gate structure and the charge trapping layer is in contact with the tunneling layer made of a silicon oxide material.

12. A memory device, comprising:
a stacked structure comprising a plurality of interlayer dielectric layers and a gate structure between adjacent interlayer dielectric layers;
a tunneling layer disposed on and extending along a sidewall of the stacked structure; and
a charge trapping layer and a blocking layer, between adjacent interlayer dielectric layers,
wherein each of the gate structure, the charge trapping layer, and the blocking layer is in contact with the tunneling layer.

13. The device according to claim 12, further comprising:
a channel layer on a sidewall of the tunneling layer, the tunneling layer separating the channel layer from the stacked structure.

14. The device according to claim 12, wherein:
in a direction perpendicular to the sidewall of the stacked structure, the charge trapping layer and the blocking layer are between the tunneling layer and the gate structure.

15. The device according to claim 12, wherein:
the blocking layer separates the charge trapping layer from the gate structure.

16. The device according to claim 15, wherein:
the blocking layer envelops the charge trapping layer and is between the charge trapping layer and the gate structure.

17. The device according to claim 12, wherein:
the blocking layer and the charge trapping layer are sandwiched between a first portion and a second portion of the gate structure in a direction along the sidewall of the stacked structure.

18. The device according to claim 17, wherein:
each of the first and second portions of the gate structure is in contact with the tunneling layer and separates the blocking layer from a corresponding interlayer dielectric layer.

19. The device according to claim 12, wherein:
the gate structure comprises a high-k dielectric layer, a work function layer, and a metal-gate layer sequentially disposed between the adjacent interlayer dielectric layers.

20. The device according to claim 12, wherein:
the plurality of interlayer dielectric layers is made of a material comprising silicon oxide;
the charge trapping layer is made of a material comprising at least one of silicon nitride, silicon oxynitride, or a high-k dielectric material; and/or
the tunneling layer is made of a material comprising at least one of silicon oxide, silicon oxynitride, or a high-k dielectric material.

* * * * *